United States Patent [19]

Taruya et al.

[11] Patent Number: 5,288,667
[45] Date of Patent: Feb. 22, 1994

[54] METHOD OF MANUFACTURING A MOLDED SEMICONDUCTOR PACKAGE HAVING A LEAD FRAME AND AN CONNECTING COUPLER

[75] Inventors: Masaaki Taruya; Mitsuru Koiwa, both of Himeji, Japan

[73] Assignee: Mitsubishi Denki Kabushiki Kaisha, Tokyo, Japan

[21] Appl. No.: 747,587

[22] Filed: Aug. 20, 1991

[30] Foreign Application Priority Data

Aug. 23, 1990 [JP] Japan .................................. 2-220037
Aug. 23, 1990 [JP] Japan .................................. 2-220038

[51] Int. Cl.⁵ ..................... H01L 21/56; H01L 21/58; H01L 21/60
[52] U.S. Cl. ..................................... 437/207; 437/211; 437/214; 437/217; 437/220
[58] Field of Search ............... 437/207, 211, 214, 217, 437/220

[56] References Cited

U.S. PATENT DOCUMENTS

| | | | |
|---|---|---|---|
| 3,418,089 | 12/1968 | Berg | 437/207 |
| 3,439,238 | 4/1969 | Birchler et al. | 437/211 |
| 4,320,412 | 3/1982 | Hynes et al. | 357/70 |
| 4,794,446 | 12/1988 | Hamano | 357/74 |
| 4,859,632 | 8/1989 | Lumbard | 437/209 |
| 5,104,827 | 4/1992 | Schneider et al. | 437/220 |

FOREIGN PATENT DOCUMENTS

| | | |
|---|---|---|
| 3033856 | 5/1982 | Fed. Rep. of Germany . |
| 0012692 | 5/1970 | Japan .................................. 437/207 |
| 110952 | 7/1982 | Japan . |
| 42939 | 3/1983 | Japan . |
| 59-19364 | 1/1984 | Japan . |
| 59-172753 | 9/1984 | Japan . |
| 60-167359 | 8/1985 | Japan . |
| 61-108158 | 5/1986 | Japan . |
| 62-88351 | 4/1987 | Japan . |
| 63-40351 | 2/1988 | Japan . |
| 63-269550 | 11/1988 | Japan . |

*Primary Examiner*—Olik Chaudhuri
*Assistant Examiner*—David E. Graybill
*Attorney, Agent, or Firm*—Sughrue, Mion, Zinn, Macpeak & Seas

[57] ABSTRACT

In a method of manufacturing a semiconductor package with an externally connecting coupler, a semiconductor package has a die pad portion on which a semiconductor device is mounted and a plurality of leads including at least one lead extending from the die pad portion and coupled to each other by a tie bar. The method includes the steps of mounting the device on the die pad of the leadframe, wire bonding between the device and inner leads, premolding the inner leads so as to ensure mutual mechanical connection of the leads and support of the leads during manufacture, cutting off unnecessary portions of the leadframe and portions of the leadframe located between the leads to electrically separate the leads from each other, and forming a mold package and the external connecting coupler as one unit using an electrically insulating resin. The mold package seals the die pad portion of the leadframe on which the device is mounted, the inner leads and the premolding. The externally connecting coupler covers the outer leads so as to achieve mechanical coupling to an external device and hence electrical connection of the outer leads. A method in which an externally connecting coupler is coupled to the leadframe before cutting off the tie bar so as to ensure mutual mechanical connection of the leads of the leadframe and support of the leads during the manufacture is also included.

6 Claims, 3 Drawing Sheets

METHOD OF MANUFACTURING A MOLDED SEMICONDUCTOR PACKAGE HAVING A LEAD FRAME AND AN CONNECTING COUPLER

BACKGROUND OF THE INVENTION

1. Field of the Invention

The present invention relates to a method of manufacturing a semiconductor package with an externally connecting coupler, and more particularly, to a method of manufacturing a semiconductor package with an externally connecting coupler which is used as the ignition device for an internal combustion engine.

2. Description of the Related Art

FIGS. 5A to 5D illustrate the conventional method of manufacturing an ignition device having a semiconductor package structure, for use in an internal combustion engine.

First, a semiconductor device (IC) 2 is die bonded on a die pad of a leadframe 1, as shown in FIG. 5A. The leadframe 1 has a plurality of leads 3. The single lead located at the center extends from the die pad. The individual leads 3 are coupled to each other in an aligned state by a tie bar. Next, as shown in FIG. 5B, the semiconductor device 2 is connected to the leads 3 using a wire 4, i.e., so-called wire bonding is conducted. Thereafter, a mold package 5 for sealing the leadframe 1 including the die pad with the semiconductor device 2 thereon and the inner leads is formed using a resin, as shown in FIG. 5C. Subsequently, unnecessary portions of the leadframe 1 are cut off to complete an IC package (semiconductor package) 6 shown in FIG. 5D.

In the aforementioned manufacturing method, portions 7 of the leadframe 1, indicated by the hatching in FIG. 6, are cut off to separate the leads from each other after the mold package 5 is formed.

It may be considered to form the semiconductor package 6 and an externally connecting coupler 8 as one unit, as shown in FIG. 7, i.e., to plastically mold the portion including the mold package 5 and the coupler 8. However, it is impossible to form the mold package 5 and the coupler 8 as one unit because it is very difficult to cut off unnecessary portions 9 and 10 (the portions indicated by the hatching in FIG. 7) of the leadframe 1 after the mold package 5 and the coupler 8 are formed as one unit. That is, since the unnecessary portion 9 which forms the upper portions (the tie bar portion) of the leads 3 shown in FIG. 7 is embedded in the resin when the mold package and the coupler are formed as one unit, it can be cut off, for example, only after the unnecessary portion 9 is exposed by taking off part of the molding resin. A gap thus remained may be charged with the resin afterwards. However, the possibility of that the water contents enter in the package increases, and the reliability of the semiconductor package reduces. It is also difficult to cut off the unnecessary portion 10 which forms the lower portions of the leads because the lower end portions of the leads 3 are accommodated in the coupler 8 when the mold package and the coupler are formed as one unit. In that case, the unnecessary portion 10 must be cut off beforehand.

In the aforementioned conventional manufacturing method, it is impossible to form the mold package and the externally connecting coupler integrally as one unit in terms of the separation of the leads and support of the leads during the molding. That is, it is impossible to assure mutual separation of the leads and support of the individual leads in an aligned state before the mold package is formed.

SUMMARY OF THE INVENTION

In view of the aforementioned problems of the conventional techniques, an object of the present invention is to provide a method of manufacturing a semiconductor package with an externally connecting coupler which enables a mold package and an externally connecting coupler to be easily formed as one unit.

In order to achieve the above object, according to one aspect of the present invention, there is provided a method of manufacturing a semiconductor package with an externally connecting coupler which comprises a step for conducting premolding to connect and support the leads and thereby to prevent the leads from being disconnected after the portions of the leadframe located between the leads are cut off, a step for cutting off the portions of the leadframe located between the leads to electrically separate the leads from each other, and a step for forming the mold package and the externally connecting coupler as one unit.

According to another aspect of the present invention, there is provided a method of manufacturing a semiconductor package with an externally connecting coupler which comprises a step for preparing an externally connecting coupler having terminals corresponding to outer leads of the leads of the leadframe, a step for coupling the coupler to the leadframe by connecting the respective terminals of the coupler to the corresponding leads so as to prevent the leads from being disconnected after the portions of the leadframe located between the leads are cut off, a step for cutting off the portions of the leadframe located between the leads to electrically separate the leads from each other, and a step for plastically sealing the leadframe together with the coupler.

DESCRIPTION OF THE PREFERRED EMBODIMENTS

Figure 1A:
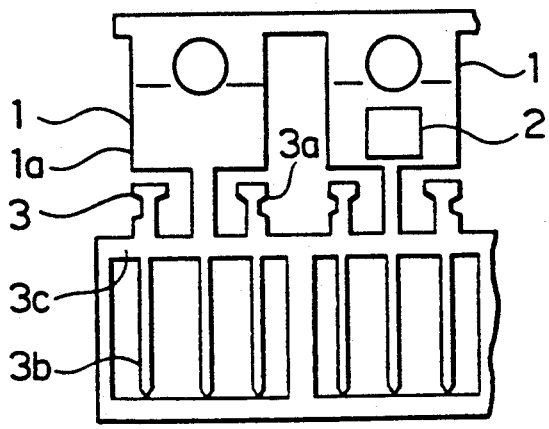
FIGS. 1A to 1D are front views showing a method of manufacturing a semiconductor package with an externally connecting coupler according to an embodiment of the present invention.

Embodiments of the present invention will be described below with reference to the accompanying drawings.

FIGS. 1A to 1D illustrate a method of manufacturing a semiconductor package with an externally connecting coupler according to a first embodiment of the present invention. The same reference numerals are used to denote parts which are the same as or similar to those shown in FIGS. 5a–5d. A leadframe 1 is the same as that employed in the conventional method. However, the leadframe 1 is illustrated as being made up of a die pad 1a and a plurality of leads 3 alone to clarify the description. Each lead 3 includes an inner lead 3a and an outer lead 3b. The single lead located at the center extends from the die pad 1a. The individual leads 3 are connected to each other by a tie bar 3c.

Figure 1B:
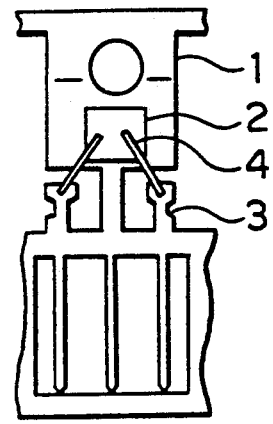

First, an IC 2, which is a semiconductor device, is die bonded on the die pad 1a of the leadframe 1, as shown in FIG. 1A. Next, as shown in FIG. 1B, wire bonding is performed between the IC 2 and the inner leads 3a of the leads 3 using a wire 4.

Figure 1C:
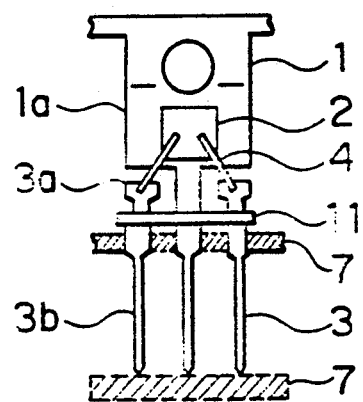
Figure 1D:
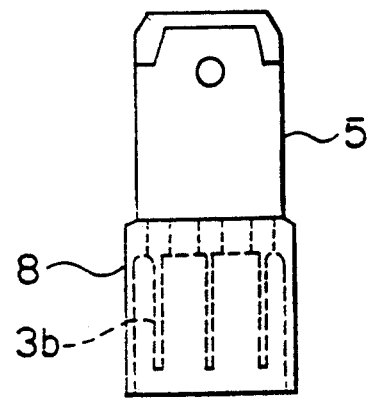

Next, premolding 11 is conducted on the inner leads 3a of the leads 3, as shown in FIG. 1C. The premolding 11 is formed of, for example, an electrically insulating resin. The premolding 11 enables the individual leads 3 to be connected to each other and to be supported by the die pad 1a. Thereafter, unnecessary portions 7 of the leadframe 1, indicated by hatching in FIG. 1C, are cut off to electrically separate the leads 3 from each other.

Subsequently, a mold package 5 and a coupler 8 are formed as one unit by an electrically insulating resin. The package 5 seals the die pad 1a with the semiconductor device 2 mounted thereon, the inner leads 3a of the leads 3 and the premolding 11, and the externally connecting coupler 8 covers the outer leads 3b to achieve mechanical connection and hence electrical connection of the outer leads 3b of the leads to an external device. The outer leads 3b extend within the coupler 8 in such a manner as to be connectable with the external device.

The aforementioned series of processes are conducted frame by frame, each of the frames including the mutually connected leadframes 1. In the frame, the plurality of leadframes 1 are coupled to each other by unnecessary portions (see FIGS. 1A to 1C) of the frame which extend sideways above the leadframes 1, respectively. These unnecessary portions are also cut off when the semiconductor packages with the coupler are separated one by one at the final stage of the manufacture.

Thus, the premolding 11 is formed before the package 5 and the coupler 8 are formed as one unit so as to ensure that the individual leads 3 are separated from each other and supported by the die pad 1 a when the package 5 and the coupler 8 are formed.

Figure 2:
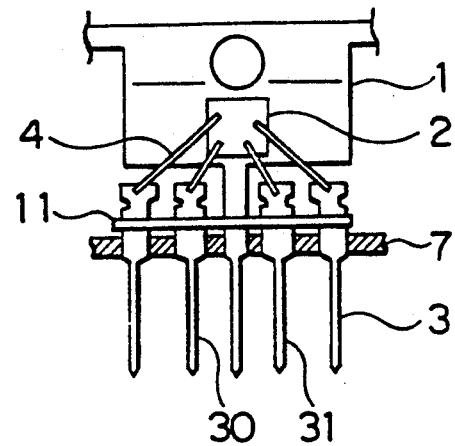
FIG. 2 is a front view showing a modification of the embodiment shown in FIGS. 1A to 1D.

FIG. 2 shows the premolding 11 conducted on a multi-pin type semiconductor package having a large number of leads 3. In this case, the premolding 11 allows internal leads 30 and 31 in the leads 3 to be particularly effectively separated from each other and supported by the die pad.

FIGS. 3A to 3D illustrates a method of manufacturing a semiconductor package with an externally connecting coupler according to a second embodiment of the present invention. The same reference numerals are used to denote parts which are the same as or similar to those in the conventional one.

Figure 3A:
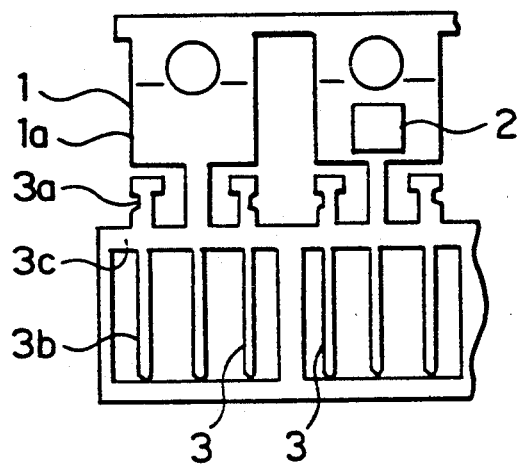
FIGS. 3A to 3D are front views showing a method of manufacturing a semiconductor package with an externally connecting coupler according to another embodiment of the present invention.
Figure 3B:
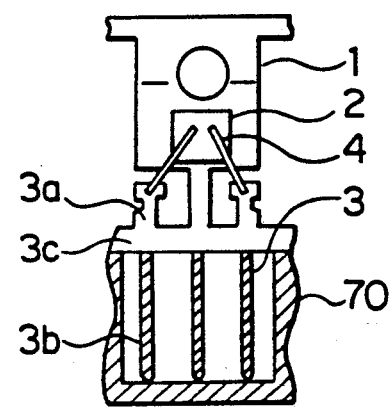

First, the IC 2 is die bonded to the leadframe 1, as shown in FIG. 3A. Next, as shown in FIG. 3B, wire bonding is conducted between the IC 2 and the inner leads 3a of the leads 3 using a wire 4. Furthermore, a portion 70 of the leadframe 1 including the outer leads 3b, indicated by hatching in FIG. 3B, is cut off as unnecessary portions. A leadframe having no hatched portion 70 may be prepared and used in this embodiment.

Figure 3C:
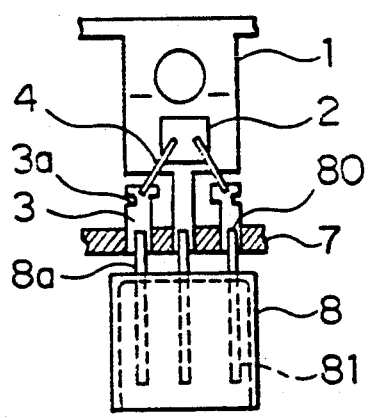
Figure 3D:
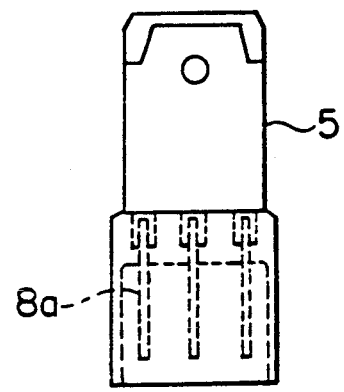

Next, the externally connecting coupler 8 having a plurality of terminals 8a, such as that shown in FIG. 3C, is formed. Each of the terminals 8a has an inner end 80 connected to each lead and an outer end 81 extending within the coupler in such a manner as to be connectable with an external device. The coupler 8 and the leadframe 1 are connected to each other by electrically connecting the inner end 80 of each of the terminals 8a of the coupler 8 to portions of the tie bar 3c of the leadframe 1 corresponding to each lead 3 by, for example, welding. Next, the unnecessary portions 7 of the tie bar 3c of the leadframe 1 shown in FIG. 3C, indicated by the hatching, i.e., the portion of the tie bar 3c located between the leads, is cut off to electrically separate the leads 3.

Next, the mold package 5 for sealing the die pad 1a with the semiconductor device 2 mounted thereon, the leads 3 and the coupler 8 containing the terminals 8a is formed. However, it must not to form the package 5 so as to entirely cover the coupler 8. The coupler 8 may be covered by the mold package 5 to such an extent as to prevent water contents from entering the package via the gap between the coupler 8 and the mold package 5.

The aforementioned series of processes are conducted on each frame, each frame including the plurality of leadframes 1. The leadframes 1 are coupled to each other by unnecessary portions (see FIGS. 3A to 3C) of the frame which extend sideways above the leadframes 1, respectively. These unnecessary portions are also cut off, for example, when the semiconductor packages are separated one by one at the final stage of the manufacture.

Thus, the coupler 8 having the plurality of terminals 8a which serve as the outer leads is prepared beforehand. The coupler 8 and the leadframe 1 are coupled to each other by connecting the individual terminals 8a to the individual leads 3 so as to ensure that the leads 3 are separated from each other and supported by the die pad when the mold package is formed. That is, when the mold package 5 is formed, the individual leads 3 can be electrically separated from each other and supported by the die pad 1a in an aligned state. Consequently, packaging of the semiconductor device and coupler as one unit can be facilitated easily. Further, an exchange of the coupler also easily can be performed.

Figure 4:
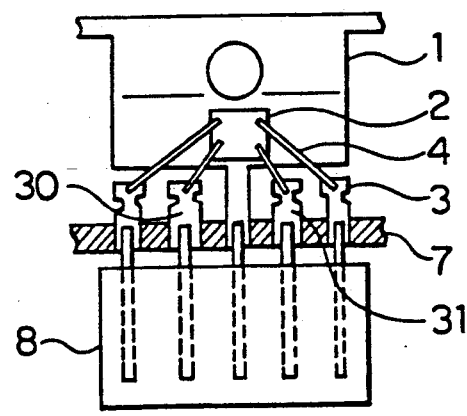
FIG. 4 is a front view showing a modification of the embodiment shown in FIGS. 3A to 3D.
Figures 5A, 5B, 5C, 5D:
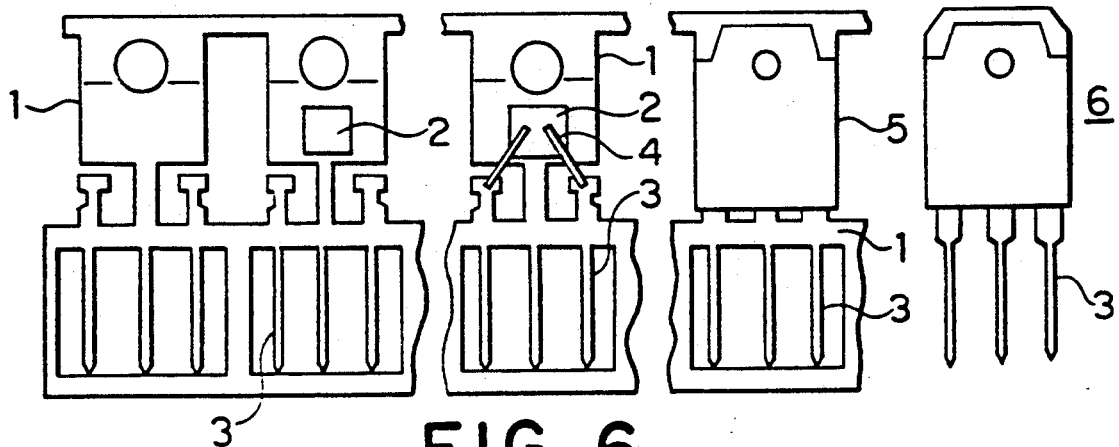
FIGS. 5A to 5D are front views showing a conventional method of manufacturing a semiconductor package with an externally connecting coupler.
Figure 6:
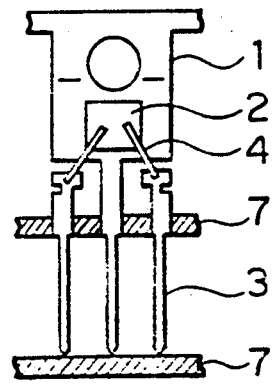
FIG. 6 is a front view showing the portion of a leadframe which is to be cut off.
Figure 7:
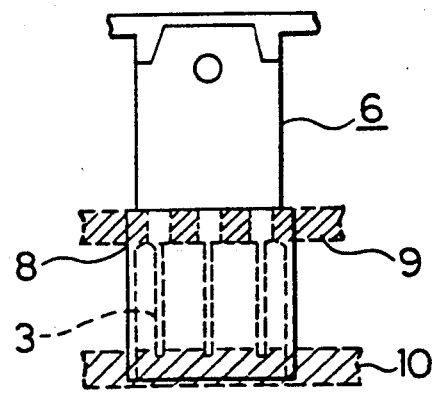
FIG. 7 is a front view illustrating when a package and a coupler are formed as one unit before the leadframe is cut off.

FIG. 4 shows the coupler 8 connected to a multi-pin type semiconductor package having a large number of leads 3. In this case, the coupler 8 allows the internal leads 30 and 31 in the leads 3 to be particularly effectively separated from each other and supported by the die pad.

When compared with the case in which separately formed semiconductor package and externally connecting coupler are coupled to each other, the semiconductor package with the externally connecting coupler according to the present invention has no gap between the mold package and the coupler and is thus more reliable because there is no possibility that the water contents enter the package.

What is claimed is:

1. A method of manufacturing a semiconductor package with an externally connecting coupler, said semiconductor package being a mold packaged leadframe having a die pad portion on which at least one semiconductor device forming an internal circuit is mounted and a plurality of leads including at least one lead extending from said die pad portion, said plurality of leads being coupled to each other by a tie bar, said method comprising the steps:

die mounting said semiconductor device on said die pad portion of said leadframe;

conducting wire bonding between said semiconductor device and inner leads of said leads;

forming the externally connecting coupler which provides mechanical connection to an external device, said coupler having a plurality of terminals, each terminal having an inner end to be connected to said lead and an outer end which is connectable to the external device;

electrically connecting the inner end of each of said terminals of said coupler to the corresponding lead in the plurality of leads of said leadframe to couple said coupler to said leadframe;

cutting off unnecessary portions of said leadframe and portions of said leadframe located between said leads so as to electrically separate said leads; and forming a mold package for packaging said die pad portion of said leadframe on which said semiconductor device is mounted, said plurality of leads of said leadframe and at least part of said coupler containing said plurality of terminals.

2. A method of manufacturing a semiconductor package with an externally connecting coupler according to claim 1 wherein said leadframe has five leads or more, the connection of said coupler having the plurality of terminals to said leadframe ensures that the leads are separated from each other and supported during the formation of the mold package.

3. A method of manufacturing a semiconductor package with an externally connecting coupler according to claim 1 wherein said semiconductor package is an ignition device for an internal combustion engine.

4. A method of manufacturing a semiconductor package with an externally connecting coupler according to claim 1 wherein the terminals of said coupler are respectively connected to the leads of said leadframe by welding.

5. A method of manufacturing a semiconductor package with an externally connecting coupler according to claim 1 wherein said leads of the leadframe include inner leads which extend from said tie bar toward said die pad portion and outer leads which extend from said tie bar in the opposite direction, said method further including the step of cutting off the outer leads of said leads prior to the step of connecting said coupler to said leadframe, such that the terminals of said coupler can be respectively connected to the portions of said tie bar corresponding to said leads in said connection step.

6. A method of manufacturing a semiconductor package with an externally connecting coupler according to claim 1 wherein said leads of the leadframe have only inner leads which extend from said tie bar toward said die pad portion, in said connection step the terminals of said coupler being respectively connected to the portions of said tie bar corresponding to said leads.

* * * * *